(12) United States Patent
Ton

(10) Patent No.: US 6,934,063 B2
(45) Date of Patent: Aug. 23, 2005

(54) MEMS MIRROR

(75) Inventor: Dinh Ton, Fremont, CA (US)

(73) Assignee: Santur Corporation, Fremont, CA (US)

( * ) Notice: Subject to any disclaimer, the term of this patent is extended or adjusted under 35 U.S.C. 154(b) by 0 days.

(21) Appl. No.: 10/211,616

(22) Filed: Aug. 2, 2002

(65) Prior Publication Data

US 2003/0039021 A1 Feb. 27, 2003

Related U.S. Application Data

(60) Provisional application No. 60/309,669, filed on Aug. 2, 2001.

(51) Int. Cl.$^7$ ......................... G02B 26/08; G02B 26/00; H04N 3/08
(52) U.S. Cl. ......................... 359/225; 359/295; 348/205
(58) Field of Search ................................. 359/198–214, 359/221, 223, 224–226, 230, 290, 291, 295, 298; 310/22, 36, 90; 348/203, 205

(56) References Cited

U.S. PATENT DOCUMENTS

| | | | |
|---|---|---|---|
| 3,646,568 A | 2/1972 | Woywood | 347/239 |
| 4,317,611 A | 3/1982 | Petersen | 359/214 |
| 4,498,730 A | 2/1985 | Tanaka et al. | 385/18 |
| 5,291,502 A | 3/1994 | Pezeshki et al. | 372/20 |
| 5,378,330 A | 1/1995 | Li et al. | 205/661 |
| 5,629,790 A | 5/1997 | Neukermans et al. | 359/198 |
| 5,715,047 A | 2/1998 | Adamovsky | |
| 5,882,468 A | 3/1999 | Crockett et al. | 156/345.3 |
| 5,949,544 A | 9/1999 | Manning | 356/452 |
| 5,999,303 A | 12/1999 | Drake | 359/224 |
| 6,044,705 A | 4/2000 | Neukermans et al. | 73/504.2 |
| 6,091,747 A | 7/2000 | Morita et al. | 372/38.02 |
| 6,201,629 B1 | 3/2001 | McClelland et al. | 359/223 |
| 6,433,390 B1 * | 8/2002 | Hara | 257/347 |
| 6,445,514 B1 | 9/2002 | Ohnstein et al. | 359/813 |
| 6,467,345 B1 * | 10/2002 | Neukermans et al. | 73/504.2 |
| 6,487,001 B2 * | 11/2002 | Greywall | 359/292 |
| 6,583,921 B2 * | 6/2003 | Nelson | 359/291 |
| 6,597,827 B1 * | 7/2003 | Brener et al. | 385/18 |
| 2002/0018334 A1 * | 2/2002 | Hill et al. | 361/278 |
| 2002/0064192 A1 | 5/2002 | Missey et al. | |
| 2002/0141690 A1 * | 10/2002 | Jin et al. | 385/18 |
| 2002/0171901 A1 * | 11/2002 | Berstein | 359/199 |

FOREIGN PATENT DOCUMENTS

| WO | WO 02/13343 A2 | 2/2002 |
|---|---|---|
| WO | WO 02/013343 A3 | 7/2003 |

OTHER PUBLICATIONS

International Search Report for International Application No. PCT/US02/24593, filed Aug. 02, 2002 dated Sep. 17, 2003 and mailed Mar. 04, 2004 ( 4 pgs.).

Daneman, et al., Laser–to–Fiber Coupling Module Using a Micromachined Alignment Mirror, IEEE Photonics Technology Letters, Mar. 1996, vol. 8, No. 3, pp. 396–398, IEEE.

Solgaard, et al., Optoelectronic Packaging Using Silicon Surface–Micromachined Alignment Mirrors, IEEE Photonics Technology Letters, Jan. 1995, vol. 7, No. 1, pp. 41–42, IEEE.

Wu, Micromachining for Optical and Optoelectronic Systems, Proceedings of the IEEE, Nov. 1997, vol. 85, No. 11, pp. 1833, 1843–1852, IEEE.

\* cited by examiner

*Primary Examiner*—Georgia Epps
*Assistant Examiner*—William Choi
(74) *Attorney, Agent, or Firm*—Christie, Parker & Hale LLP

(57) ABSTRACT

A MEMS mirror and method for fabricating the mirror is provided. The mirror has a plurality of structures that operatively rotate around a support structure. The mirror is fabricated, such that the silicon components are separated from a glass structure having electrodes to prevent shorting of the electrodes to the mirror. Additionally, the electrodes are positioned such that providing electrical contact is eased.

16 Claims, 8 Drawing Sheets

MEMS MIRROR

CROSS-REFERENCE TO RELATED APPLICATIONS

This application claims the benefit of Provisional Patent Application No. 60/309,669, entitled MEMS Mirror, filed Aug. 2, 2001, the disclosure of which is incorporated by reference.

BACKGROUND

The present invention relates generally to a Micro-Electrical Mechanical System (MEMS) mirror, and more particularly to a double axis MEMS mirror.

Micro electrical mechanical systems are useful in a variety of applications. One such application is as a moveable mirror for redirecting light. A single axis mirror, however, does not always provide the ability to redirect light from a light source as desired. Moveable mirrors may also exhibit flex or other unwanted distortional effects. Also, placement of electric pads to move the mirror may be difficult, and providing electrical access to those pads may cause manufacturing and operational difficulties. In addition, MEMS mirrors may be constructed using different materials or structures, and the bonding of different materials or structures may result in damage to the mirror, resulting in decrease yields.

BRIEF SUMMARY OF THE INVENTION

The present invention provides a MEMS mirror. In one aspect of the invention, the MEMS mirror comprises a first and second structure and a support structure. The first structure is configured to operatively rotate about a first axis and comprises a reflective layer. The second structure is coupled to the first structure and configured to operatively rotate about a second axis. The support structure is coupled to the second structure and substantially surrounds the first and second structures. A plurality of electrodes is also provided. Each electrode extends under a portion of the first and second structures and is recessed in the support structure, such that the electrodes are prevented from contacting the reflective layer.

In another aspect of the invention, a method of fabricating a micro-electrical mechanical system mirror is provided. A glass wafer is etched to create at least one recess in the glass wafer. Also, metal is deposited in the at least one recess of the Pyrex wafer and a silicon wafer having a reflective layer is bonded to the glass wafer.

In a further aspect of the invention, a micro-electrical mechanical system mirror comprises a first tilt means, a second tilt means and a support means. The first tilt means comprises a reflective layer and the second tilt means is coupled to the first tilt means. The support means is coupled to the second tilt means and substantially surrounds the first and second tilt means. Additionally, the support means has a plurality of etched recesses, the recesses having metal deposits.

Many of the attendant features of this invention will be more readily appreciated as the same becomes better understood by reference to the following detailed description and considered in conjunction with the accompanying drawings.

DETAILED DESCRIPTION

Figure 1:
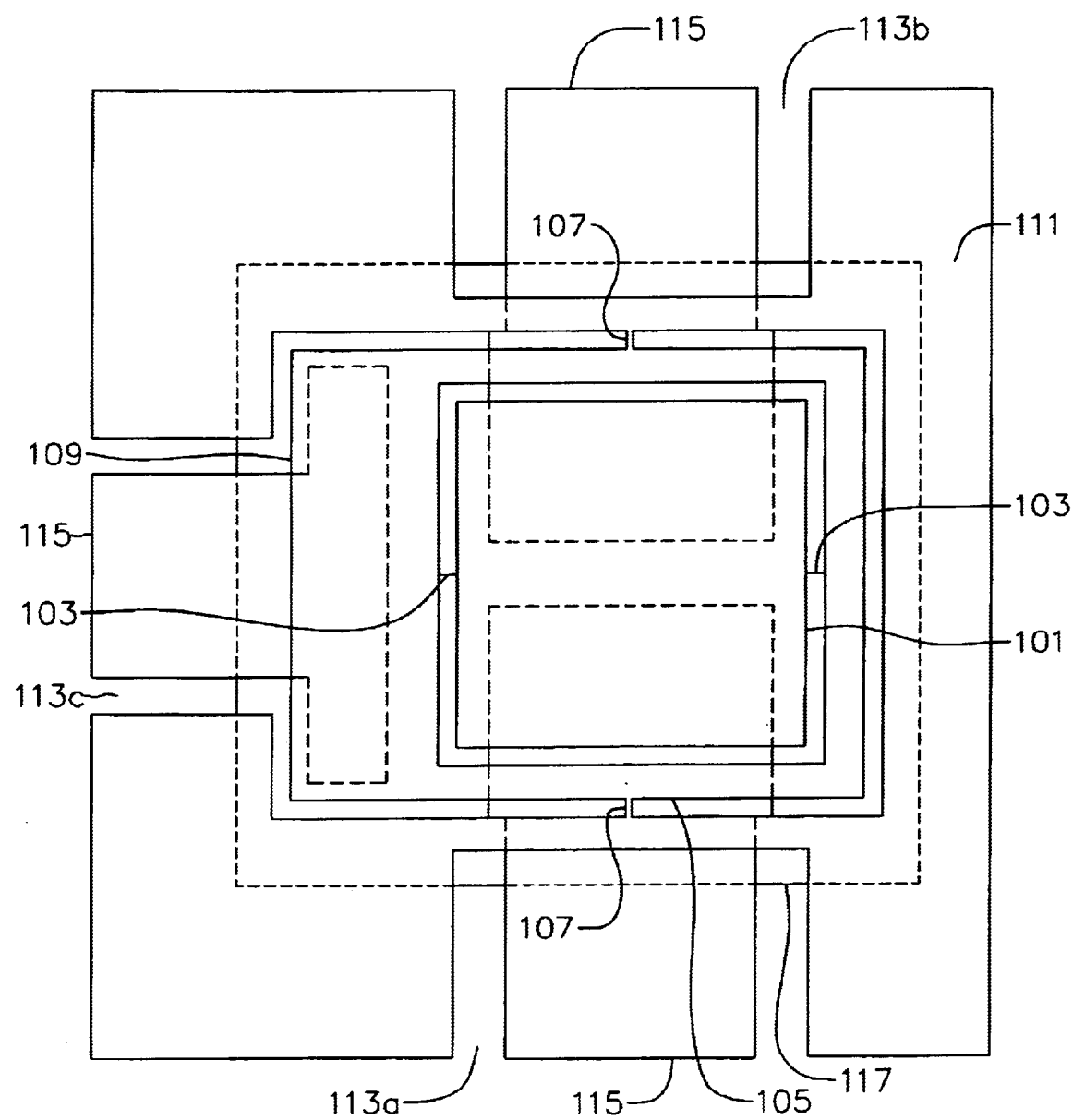
FIG. 1 illustrates a top view of one embodiment of a MEMS mirror.

A MEMS mirror in accordance with aspects of the invention is illustrated in FIG. 1. The mirror includes a reflective element 101. The reflective element is a reflective substance coated on a first tilt structure. The first tilt structure is attached to a second tilt structure 105 by two thin links 103. As illustrated the two thin links are on opposing sides of the first tilt structure, and are coaxial with respect to the first tilt element. The two thin links allow the first tilt structure to rotate about the axis when a torque is applied to the first tilt element about the axis.

The second tilt structure is located around the first tilt structure. The second tilt structure is linked to a support structure 111 by a further two thin links 107. The further two thin links, as illustrated, are substantially coaxial, and are substantially perpendicular to the two thin links. The further two thin links allow the second tilt structure to be rotated about a second axis when a torque is applied to the second tilt structure about the second axis. The second tilt structure is asymmetric in that the second tilt structure includes an edge 109 on one side of the first tilt structure of greater surface area than on another side of the opposing side of the first tilt structure.

The support structure substantially surrounds the second tilt structure. The support structure includes three apertures or gaps 113a–c. The three gaps include two gaps 113a,b on opposing sides of the first and second tilt structures. The third gap 113c is located on a side perpendicular to the first two gaps. The third gap is on the side of the edge of the second tilt structure having greater surface area. Placed under the opposing gaps are metal contact pads 115. The contact pads extend inward from the gaps under the first tilt structure. The metal contact pads extend towards the middle of the first tilt structure, but do not reach the center. Similarly, a further metal contact pad is placed under the third gap, and extends inward under the greater surface area of the second tilt structure. As illustrated, the contact pads increase in area when under the tilt structures.

In operation, voltage is applied to the contact pads to cause movement of the tilt structures. A differential voltage applied to the opposing metal contact pads causes rotation of the first tilt structure. A voltage applied to the third metal contact pad results in rotation of the second tilt structure. Accordingly, control of the movement of the first tilt structure and the second tilt structure results in the reflective surface on the first tilt structure being moveable along two axis.

In one embodiment, the mirror is 1500 by 1500 microns, with a thickness of 5 microns. The hinges, or links from the first tilt structure to the second tilt structures are 5 microns by 5 microns by 100 microns. The hinges from the second tilt structure to the support surface are 6 microns by 5 microns by 100 microns. A gap between the mirror and the metal contact pads or electrodes is about 100 microns. In one embodiment, additional support structure 117 underlies the first tilt structure, second tilt structure, support structure, and metal contact pads.

In various embodiments, different process flows are used for fabrication of the MEMS mirror. In one embodiment, the mirror is fabricated using a Pyrex-Si membrane anodic bonding-SOI wafers process. In another embodiment, a Pyrex-Si membrane anodic bonding-EPI process is used. In a further embodiment, a Pyrex-Si anodic bonding-SIU-moat in Pyrex process is used. Yet a further process an Si—Si membrane fusion bonding-SOI process is used.

Figure 2:
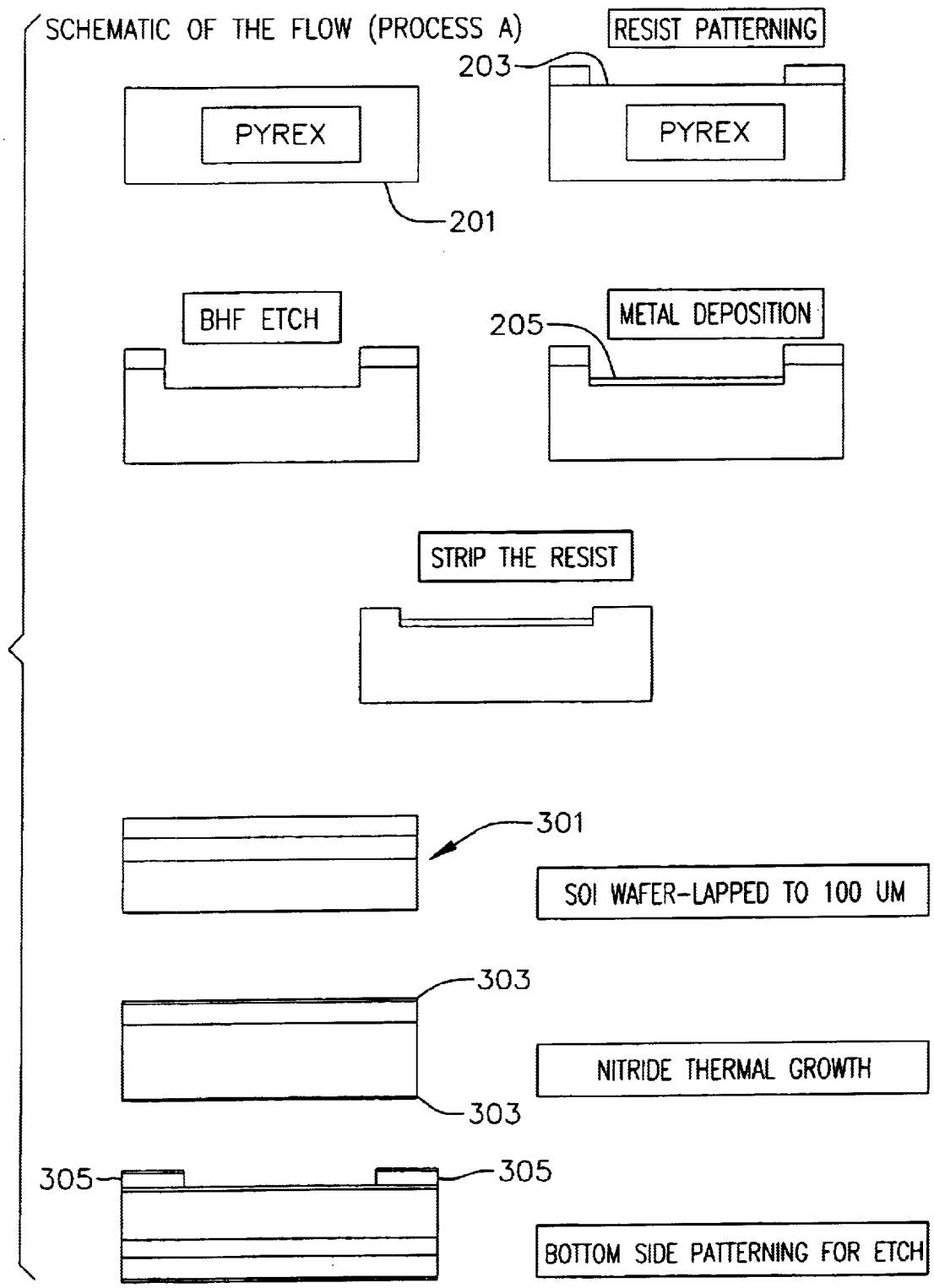
FIG. 2 illustrates a process flow of one embodiment used in fabricating a MEMS mirror.
Figure 3:
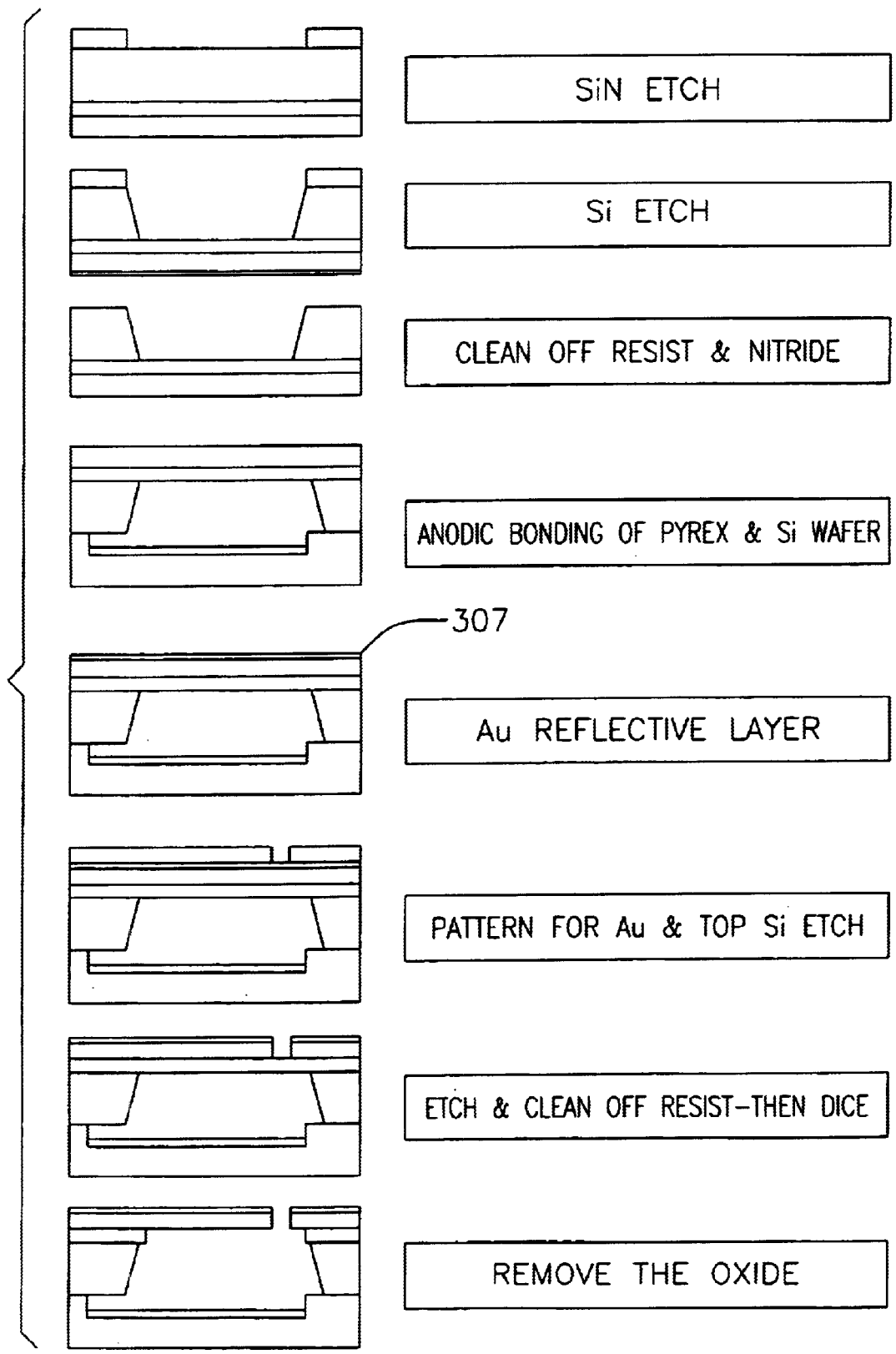
FIG. 3 illustrates a continued process flow of the process flow illustrated in FIG. 2.

For the Pyrex-Si membrane anodic bonding-SOI wafers, a flow illustrating the fabrication of the elements is discussed below in view of FIGS. 2–3. As shown, a 250 to 500 micron thick Pyrex wafer 201 is provided. The wafer is cleaned, and a section 203 is removed using lithography. The removed section is for placement of metal electrodes. The removed surface is etched using buffered HF, with the etch being about 1 micron. The electrodes 205 are placed on the removed portion through a metal deposition process, with metalization forming approximately 5,000 Angstroms of gold. The HF etch is used to avoid potential difficulties in the event the mirror snaps from misalignment during later anodic bonding. In the event the mirror snaps the HF etch helps avoid shorting of the circuit. In the event of misalignment the HF etch helps prevent a short.

The silicon SOI 301 wafer is 5 microns by 1 or 2 microns by 100 microns. The wafer is cleaned, and lapped and polished to about 100 microns. The wafer is then cleaned and a thermal growth of SiNx 303 for topside protection and as a mask for the bottom side is applied. The bottom side is patterned 305 and the SiNx mask layer is dry or wet etched. The Si bottom layer is then dry or wet etched, stopping the etching at the outside stop etch layer. A TMAH wet etch is used on one embodiment for stopping at the oxide stop etch layer. A dry etch with STS multiplex ICP is used in a further embodiment. The wafer is then cleaned.

The Pyrex and Si wafer are then cleaned with RCA1. The Pyrex and Si wafer are then anodic bonded. A 500 Angstrom gold layer 307 is deposited on the top surface as a reflective layer. The gold surface and the top of the silicone is then etched using a dry etch. The device is then diced and then cleaned with a buffered HF to remove the supporting oxide.

In various embodiments described above and below, to avoid dicing problems, after the bottom Si etch, the wafer is bonded to the Pyrex, and patterned for the top Si etch, with the dicing occurring before the top Si etch. In such an embodiment the wafer is washed with water to clean up before doing the final etch. In another embodiment the metal is deposited for the reflection area and the oxide is removed with HF. The HF step in one embodiment is done after the bottom Si etch to help release stress on the top Si wafer before patterning for the top Si etch. In such an event, in one embodiment a low stress SiN layer is also deposited.

For Pyrex-Si Membrane anodic bonding—EPI processing, the process is similar to the previously described SOI wafer process. However, a silicon EPI wafer is used in place of the silicon SOI wafer. In one embodiment, the silicon EPI wafer is about 5 um heavily dope, low stress silicon on 500 um thick silicon P/B dope wafer. Additionally, the silicon bottom layer is etched using KOH etch, stopping etching at the EPI layer. In one embodiment, about 2,000 Angstrom of Aluminum or SiNx is deposited on the bottom side of the silicon EPI wafer as an etch stop layer which provides for a clean etch. Similar to the SOI wafer process, the supporting layer is cleaned off. If the supporting layer is Aluminum, then dry etching is performed.

In the Pyrex-Si anodic bonding-SIU-moat in Pyrex process, a Pyrex wafer and a silicon SOI wafer are provided. The Pyrex wafer is cleaned and patterned for HF etching using mask materials such as Nickel. The wafer is RIE wet etched using about 100 um etch moat. The Pyrex wafer is cleaned again with HF and RCA. Through metalization and shadow masking, electrodes are placed or formed on the Pyrex wafer. In one embodiment, Pyrex with grind 100 um deep structure ultrasonic grind is used.

The silicon SOI wafer is cleaned and patterned for top surface silicon etching. Thus, the SOI wafer is etched and, in one embodiment, RIE is used. The Pyrex and SOI wafer are cleaned with RCA1 and then the Pyrex and Si wafer are anodic bonded. The Pyrex and anodic bonded SOI wafer are back grind to the thickness of the thickness of the Pyrex plus about 50 um. The wafer is diced and wet etch, such as KOH/TMAH, is applied to the bottom side of the wafer to remove any remaining support silicon. In one embodiment, TMAH etch is used to allow the selectivity of the silicon or silicon oxide (SiOx). A HF etch is then used to remove the oxide layer and about a 500 Angstrom of gold is deposited as the reflective layer.

In the silicon-silicon membrane fusion bonding-SOI process, two silicon wafers are utilized. The bottom silicon wafer is cleaned and a thermal growth of Nitride is applied. The Nitride is then etched using buffered HF or KOH etch. The etching is performed to provide a 100 um deep moat. The wafer is then cleaned and through metalization, electrodes are formed. The top silicon wafer is cleaned and patterned for top surface silicon etching. Thus, the SOI wafer is etched and, in one embodiment, RIE is used. The top and bottom silicon wafers are then fusion bonded. In other embodiments, instead of using fusion bonding, the bonding of the top silicon wafer with the bottom silicon wafer containing the electrodes is performed using eutectic bonding, soldered bonding, or thermo-compression bonding. The bonded wafer is backgrinded to a thickness of the bottom silicon wafer plus about 50 um. The bonded wafer is diced and wet etch, such as KOH/TMAH, is applied to the bottom side of the wafer to remove any remaining support silicon. In one embodiment, TMAH etch is used to allow the selectivity of the silicon or silicon oxide (SiOx). A HF etch is then used to remove the oxide layer and about a 500 Angstrom of gold is deposited as the reflective layer.

Figure 4:
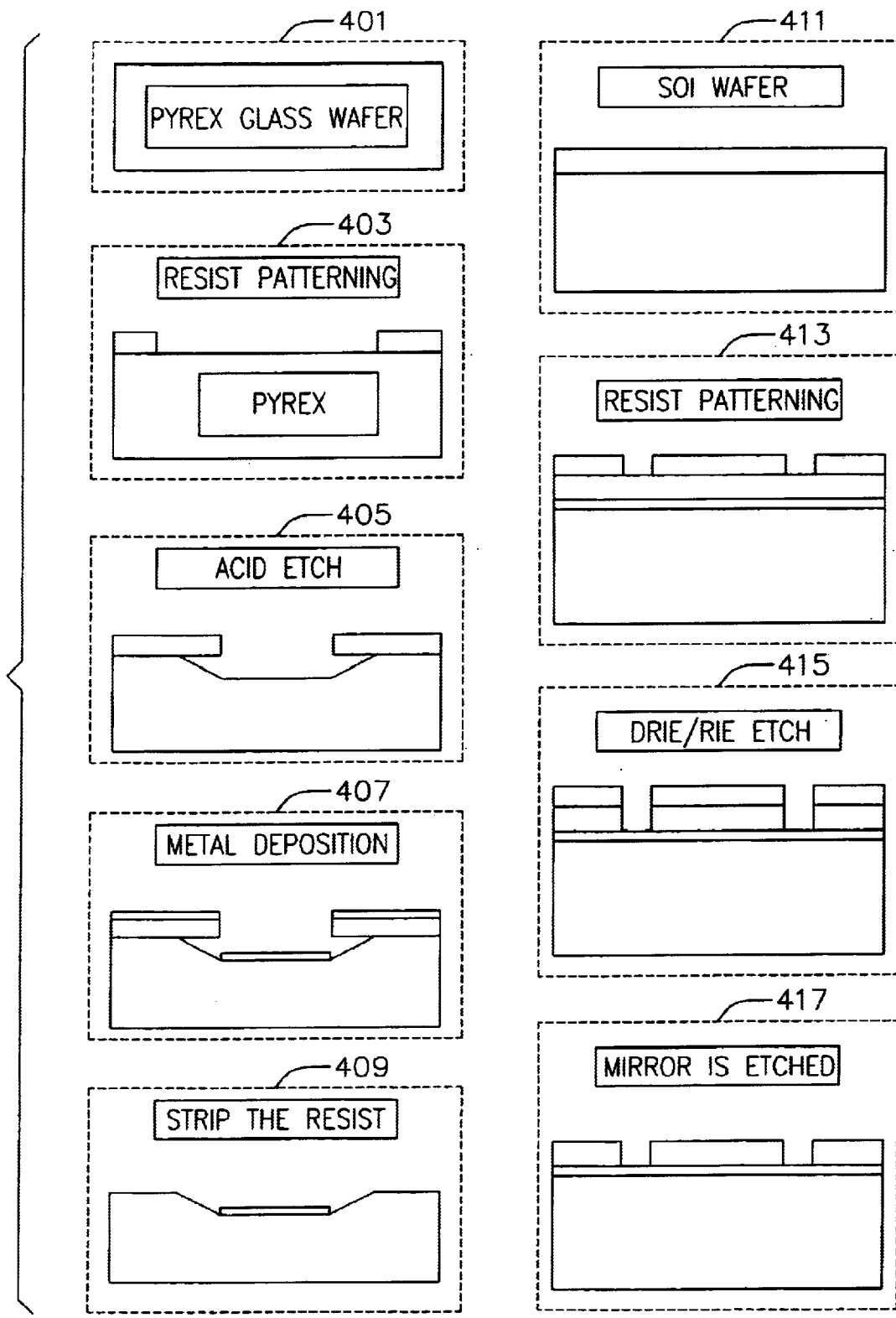
FIG. 4 illustrates a process flow of one embodiment used in fabricating a MEMS mirror.
Figure 5:
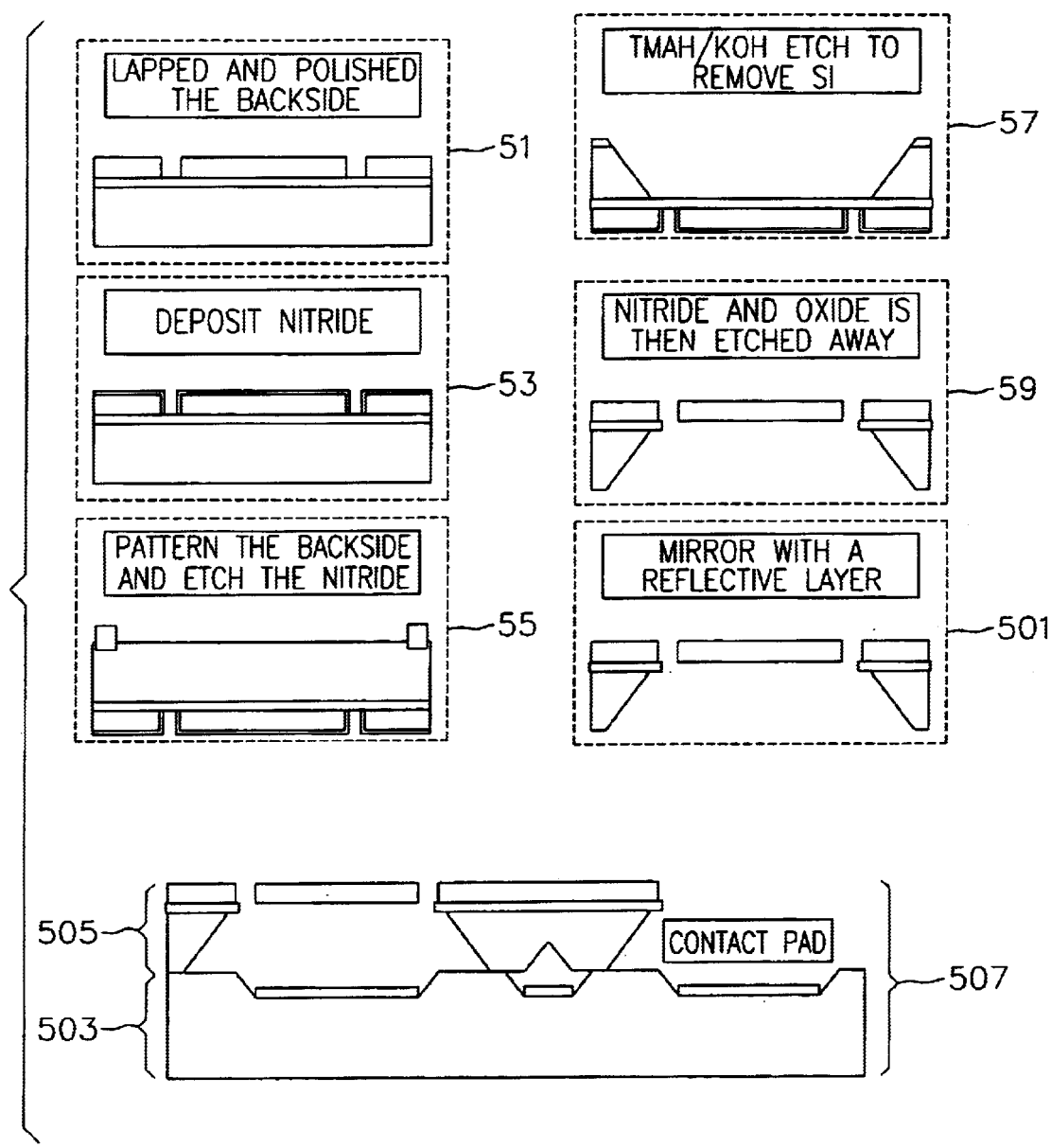
FIG. 5 illustrates a continued process flow of the process flow illustrated in FIG. 4.

In one embodiment, as shown in FIGS. 4 and 5, the MEMS mirror comprises a Pyrex or glass base 503 at the bottom of the MEMS mirror and a silicon mirror and frame components 505 at the top of the MEMS mirror. In one embodiment, the glass base is a Borosilicate glass base. The glass base has electrodes. Using an anodic bonding process, the glass base and the silicon components are "glued" together at the wafer-scale. The whole wafer is diced and individual mirrors are then cleaned and packaged for use.

In one embodiment, a Pyrex Wafer 401 is modified to include metal electrodes. The Pyrex or glass wafer used, in one embodiment, is about 500 um thick. For 4" wafers, this thickness offers eases handling and creates less particles during dicing. The Pyrex wafer is patterned for the evaporation of the electrode in block 403. However, before the metal deposition in block 407, the Pyrex is first etched down by several microns to ten of microns deep in block 405. The etching can be done in hydrofluoric acid (or BOE) or in a DRIE system with the capability of etching oxide. A wet etch process with acid can also be used. In the wet etch process, a resist mask is used to provide a shallow etch (<5 um) and another type of mask, such as silicon or chromium, is used for a deeper etch. In block 409, the resist is stripped.

By etching of the glass before the metal deposition, the later deposited electrodes will be recess from the top of the glass which prevents the mirror from touching the electrodes, i.e., shorting, if a snap-down condition occurs. A snap-down condition occurs when charge on an electrode causes the mirror to forcibly move toward an electrode and if uninhibited, the mirror contacts an electrode causing a short.

Additionally, by etching of the glass before the metal deposition, the electrodes do not short to the body of the top silicon after the anodic bonding which allows for coarse misalignment of the Pyrex wafer to the Silicon wafer. Furthermore, access to the electrodes is increased and thus allows the electrode to be easily connected to its respective contact pad. The isotropic nature of the etch also allows for an easy liftoff of the metal after deposition.

The silicon wafers, in one embodiment, are SOI (Silicon-On-Insulator) wafers. These wafers comprise a handle wafer having a thickness of about 500 um, an oxide layer on top, and a device layer of crystalline silicon. The device layer becomes the first structure having a reflective element. The oxide layer serves as an etch-stop layer for the process. The handle wafer forms a support structure for the first structure and separates the reflective element from the electrode. The SOI wafer, in one embodiment, has an oxide thickness of about 0.25 um.

The oxide layer serves as an etch stop layer for various etch processes, such as etching from the top during a Bosch etch process or RIE, and etching from the bottom during a wet etch (KOH, TMAH) or even Bosch etch process. Also, oxide film is very compressive and thus this compressive stress can rip the mirrors apart during etching or cause the hinges or links of the mirrors to break or etch away.

SOI wafers of thickness (500 um handle, 0.25 um oxide, and 15 um device) are used in block 411. The thickness of the device layer is chosen to give the optimum operating condition of the device for a specific application. First, the device layer is patterned in block 413 and etched either with RIE or DRIE system to form the shape of the mirror in block 415. In block 417, the mirror is etched and the resist is stripped.

The wafer is then lapped and polished to desired thickness to form the separation between the electrode and the mirror body in block 51. After the lapping and polishing, in block 53, the wafer is coated with silicon nitride to form a protective layer to the mirror side of the wafer (top side) for the subsequent wet etch step. During the same nitride deposition, the bottom side of the wafer is also coated. In block 55, the bottom nitride is patterned and served as the mask for the wet etch step. Instead of the nitride, a layer of oxide can be grown to serve the same purpose. The etching is done, in block 57, to remove all the silicon below the mirror to allow the mirror to move and also to remove all the silicon near the pads of the electrodes to allow for easy access to do wire bonding. The wet etch is done either in TMAH or KOH. The nitride protective layer and mask can be removed using heated phosphoric acid, in block 59. Additionally, in block 59, the oxide is etched away in hydrofluoric acid (or BOE) and the mirror is then totally released.

A reflective coating is deposited on top of the mirror surface in block 501. For metal that can form eutectic with silicon at high temperature (~350° C. for the anodic bonding process), an isolation layer is deposited in between. Gold is the choice for the reflective coating for most telecommunication applications. It also forms eutectic with silicon at 360° C. A layer of platinum, nitride, or oxide is used to separate gold from silicon. For the described process, a 40 nm of nitride/5 nm of titanium (as an adhesive layer)/100 nm of gold is used. The Pyrex glass wafer with electrodes is bonded to the SOI wafers with the movable mirrors to finish the process as shown in block 507.

Figure 6:
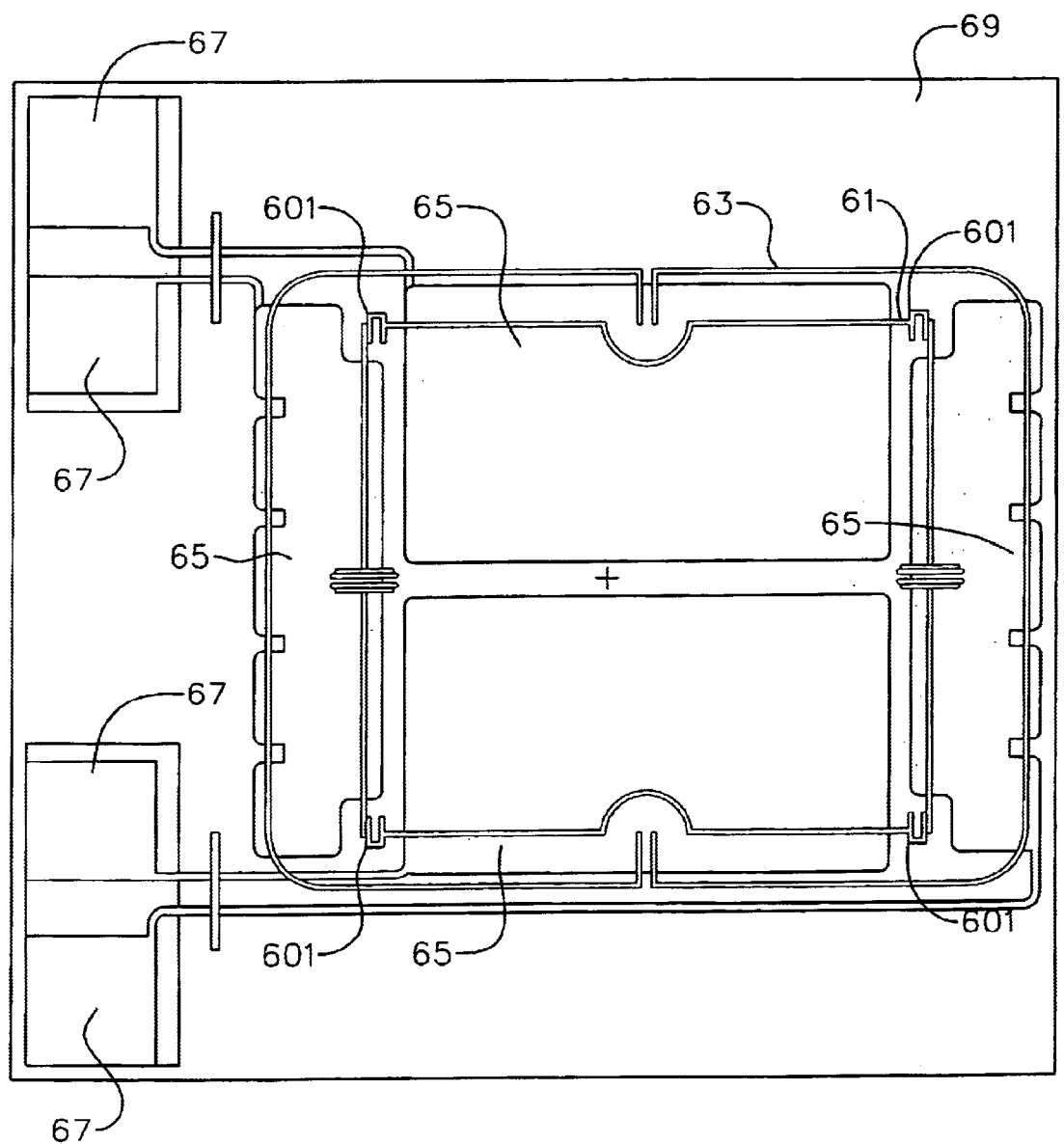
FIG. 6 illustrates a top view of another embodiment of a MEMS mirror.
Figure 7:
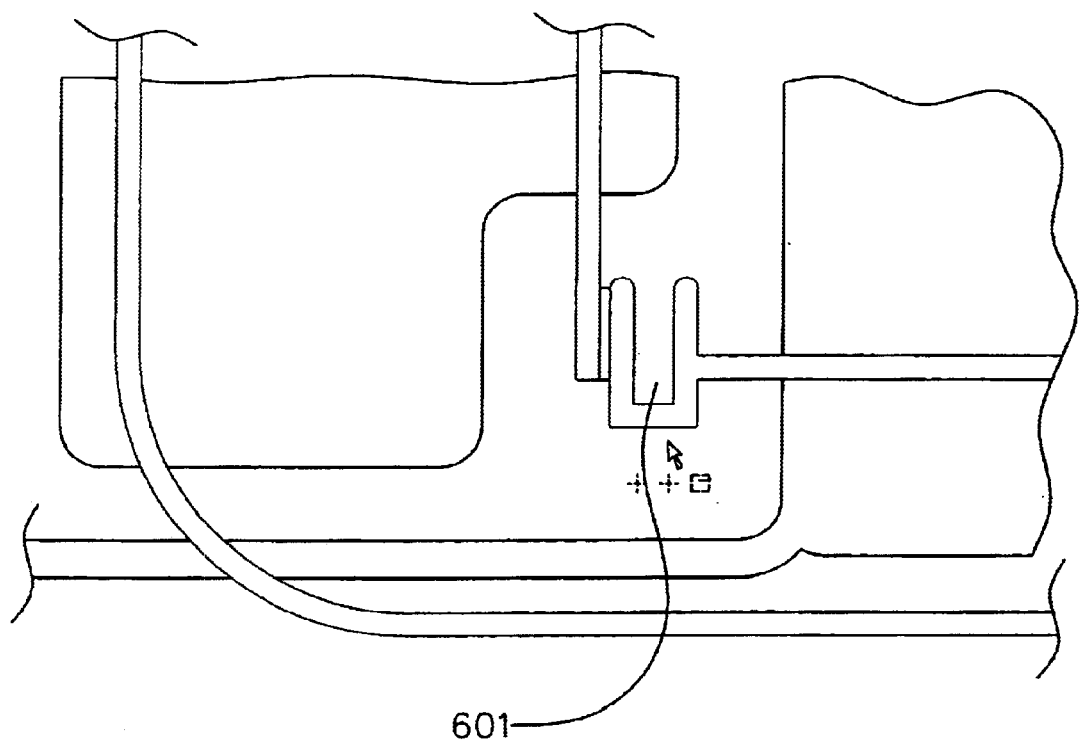
FIGS. 7–8 illustrates a close up views of one embodiment of a MEMS mirror.
Figure 8:
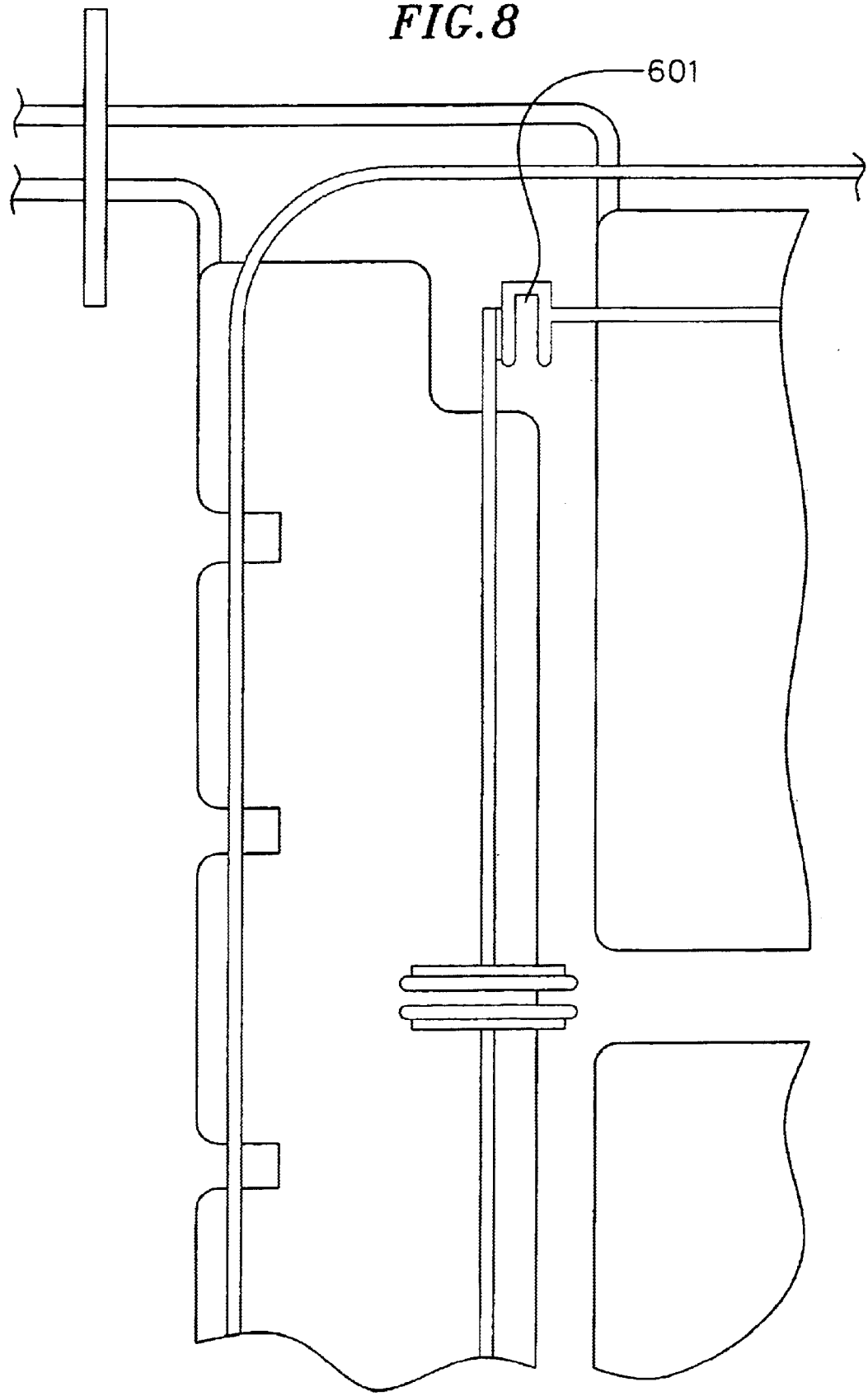

In FIGS. 6–8, another embodiment of a MEMS mirror is shown. As shown in FIGS. 6–8, the MEMS mirror comprises a first structure or inner mirror 61, a second structure 63, a glass or Pyrex substrate 69, and electrodes 65. In one embodiment, a third structure is also provided and is coupled to the second tilt structure, but is not shown here for clarity. The electrodes are embedded in recesses formed in the Pyrex substrate to prevent physical contact with the electrodes and the inner mirror. Coupled to the electrodes are traces to respective pads 67 where voltage is supplied to move or control, for example, the inner mirror.

The inner mirror further includes multiple legs or tabs 601. FIGS. 7–8 illustrate close up views of the tabs 601. During processing or fabrication, the legs or tabs give a minimum area of contact of the inner mirror to the Pyrex substrate, and thus lessens the chance that the inner mirror would bond directly onto the electrodes. Additionally, during operation, the legs prevent electrical shortage from occurring if a snap-down condition occurs. Furthermore, the legs act like springs to push the mirror back to a normal state when voltage to the electrode is removed.

If an EPI wafer is used, the above described silicon SOI and Pyrex anodic bonding process is similarly used. EPI wafers are silicon wafers in which the top few microns are heavily doped to give a very high selectivity to the wet etch processes, such as a KOH etch. Similar to the SOI and Pyrex wafer, a separation between the electrode and the mirror is made by etching the glass to the desired depth. Also, in one embodiment, the metal electrode is shadow evaporated on the glass.

Thus, the present invention provides a MEMS mirror. Although the present invention has been discussed with respect to certain embodiments, it should be recognized that the invention is defined by the claims supported by this disclosure and their equivalents.

What is claimed is:

1. A micro-electrical mechanical system mirror comprising:
   a first structure configured to operatively rotate about a first axis, the first structure comprising a reflective layer;
   a second structure coupled to the first structure and configured to operatively rotate about a second axis;
   a support structure coupled to the second structure and substantially surrounding the first and second structures; and
   a plurality of electrodes, each electrode extending under a portion of the first and second structures and embedded in a recess etched from the top of the support structure so as to prevent physical contact between the electrodes and the first structure;
   wherein the plurality of electrodes further comprises:
   a first electrode extending under the first and second structure on a first side of the first and second structures;
   a second electrode extending under the first and second structure on a second side of the first and second structures, the second side being an opposing side of the first side; and
   a third electrode extending under the first and second structure on a third side of the first and second structures, the third side being substantially perpendicular to the first and second sides.

2. A micro-electrical mechanical system mirror comprising:
- a first structure configured to operatively rotate about a first axis, the first structure comprising a reflective layer;
- a second structure coupled to the first structure and configured to operatively rotate about a second axis;
- a support structure coupled to the second structure and substantially surrounding the first and second structures; and
- a plurality of electrodes, each electrode extending under a portion of the first and second structures and recessed from the top of the support structure, such that the electrodes are prevented from contacting the reflective layer, the plurality of electrodes comprising a first electrode extending under the first and second structures on a first side of the first and second structures, a second electrode extending under the first and second structures on a second side of the first and second structures, the second side being an opposing side of the first side, and a third electrode extending under the first and second structures on a third side of the first and second structures, the third side being substantially perpendicular to the first and second sides, wherein the support structure has a plurality of apertures and the first, second and third electrodes, each have a portion that extends along an aperture of the plurality of apertures of the support structure.

3. The mirror of claim 2 wherein the first, second and third electrodes are configured to cause the first and second structures to move.

4. A micro-electrical mechanical system mirror comprising:
- a first structure configured to operatively rotate about a first axis, the first structure comprising a reflective layer,
- a second structure coupled to the first structure and configured to operatively rotate about a second axis;
- a support structure coupled to the second structure and substantially surrounding the first and second structures; and
- a plurality of electrodes, each electrode extending under a portion of the first and second structures and recessed in the support structure, such that the electrodes are prevented from contacting the reflective layer, wherein the first structure further comprises tabs, the tabs extending from the first structure and preventing the first structure from directly contacting at least one of the plurality of electrodes.

5. The mirror of claim 4 wherein the first, second and third electrodes comprise gold.

6. A micro-electrical mechanical system mirror comprising:
- a first structure configured to operatively rotate about a first axis, the first structure comprising a reflective layer;
- a second structure coupled to the first structure and configured to operatively rotate about a second axis;
- a support structure coupled to the second structure and substantially surrounding the first and second structures; and
- a plurality of electrodes, each electrode extending under a portion of the first and second structures and recessed from the top of the support structure, such that the electrodes are prevented from contacting the reflective layer, wherein the support structure has a plurality of apertures and each electrode extends through an aperture of the plurality of apertures.

7. A method of fabricating a micro-electrical mechanical system mirror, the method comprising:
- removing a section of a glass wafer using lithography to create at least one recess in the glass wafer;
- etching the at least one recess from the top of the glass wafer;
- embedding electrodes in the at least one recess of the glass wafer through metal deposition process such that the electrodes are recessed from the top of the glass wafer; and
- bonding a silicon wafer having a reflective layer to the glass wafer.

8. The method of claim 7 wherein the electrodes are gold and the glass wafer is a Pyrex wafer.

9. The method of claim 8 wherein the bonding is anodic bonding.

10. The method of claim 7 further comprising creating tabs extending from corners of the reflective layer.

11. The method of claim 7 further comprising providing access to the electrodes via the at least one recess.

12. The method of claim 7 wherein the silicon wafer is a silicon on an insulator wafer.

13. A micro-electrical mechanical system mirror comprising:
- a first tilt means comprising a reflective layer;
- a second tilt means coupled to the first tilt means; and
- a support means coupled to the second tilt means and substantially surrounding the first and second tilt means, the support means have a plurality of etched recesses, the etched recesses having embedded metal deposits to prevent physical contact between the first tilt means and the metal deposits;
- wherein the first tilt means further comprises extension means protruding from the first tilt means to prevent the reflective layer from contacting the metal deposits.

14. The method of claim 13 further comprising contact means configured to receive energy and charge the metal in the etched recesses.

15. A method of fabricating a micro-electrical mechanical system mirror, the method comprising:
- etching the top of a glass wafer to create at least one recess in the glass wafer;
- depositing metal in the at least one recess etched from the top of the glass wafer, such that the deposited metal is recessed from the top of the glass wafer;
- bonding a silicon wafer having a reflective layer to the glass wafer; and
- creating tabs extending from corners of the reflective layer to prevent the reflective layer from contacting the metal deposit.

16. A micro-electrical mechanical system mirror comprising:
- a first tilt means comprising a reflective layer;
- a second tilt means coupled to the first tilt means; and
- a support means coupled to the second tilt means and substantially surrounding the first and second tilt means, the support means have a plurality of etched recesses, the recesses having metal deposits,
- wherein the first tilt means comprises an extension means protruding from the first tilt means to prevent the reflective layer from contacting the metal deposits.

* * * * *